United States Patent [19]

Schoettmer

[11] Patent Number: 4,939,396

[45] Date of Patent: Jul. 3, 1990

[54] DETECTOR CIRCUIT

[75] Inventor: Ulrich Schoettmer, Gechingen, Fed. Rep. of Germany

[73] Assignee: Hewlett-Packard Company, Palo Alto, Calif.

[21] Appl. No.: 303,693

[22] Filed: Jan. 27, 1989

[30] Foreign Application Priority Data

Jan. 28, 1988 [EP] European Pat. Off. ........ 88101209.0

[51] Int. Cl.$^5$ .................... G01R 19/145; H03K 19/02
[52] U.S. Cl. .................... 307/518; 307/234; 307/443; 307/480; 307/269; 328/63; 328/109; 328/151
[58] Field of Search ............... 307/518, 234, 443, 480; 328/269, 63, 109, 151

[56] References Cited

U.S. PATENT DOCUMENTS 3,942,037  3/1976  Mensch, Jr. .................... 307/518

FOREIGN PATENT DOCUMENTS 3346942  1/1985  Fed. Rep. of Germany .
56-27659  3/1981  Japan .
2109651  11/1981  United Kingdom .
2165113  9/1985  United Kingdom .

OTHER PUBLICATIONS

"Designer's Casebook, Logic Monitors Changes in Channel Input State"; Electronics International; vol. 56, No. 14; Jul. 1983; p. 132, A. Karapetian.

"Timing Characterization Circuit"; IBM Technical Disclosure Bulletin; J. King; vol. 27, No. 9; Feb. 1985; pp. 5266–5269.

"Logic Analyzers Mount a Three-Pronged Attack on Hardware and Software Debugging", Electronic Design; B. Milne; vol. 31, No. 19; Sep. 1983; pp. 93–108.

Primary Examiner—Stanley D. Miller
Assistant Examiner—M. Wambach
Attorney, Agent, or Firm—Karl E. Bring

[57] ABSTRACT

A detector circuit for detecting a state change of an unknown binary signal has a control circuit generating two pulse sequences which are shifted in time against each other and two flip-flops. The first pulse sequence activates the first flip-flop and clears the second one, whereas the second pulse sequence activates the second flip-flop and clear the first one. Therefore, the two flip-flops are prepared to trigger on transitions of the unknown binary signal to be tested alternatingly. Such a detector circuit can be used to avoid undue restrictions caused by the necessary recovery time of a single flip-flop.

8 Claims, 11 Drawing Sheets

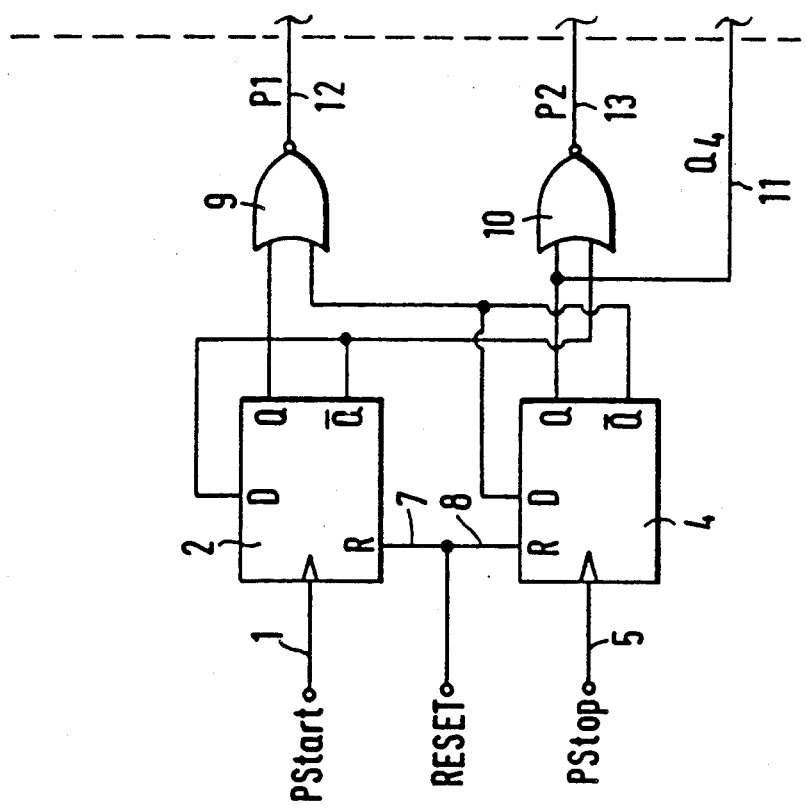

FROM FIG 1A

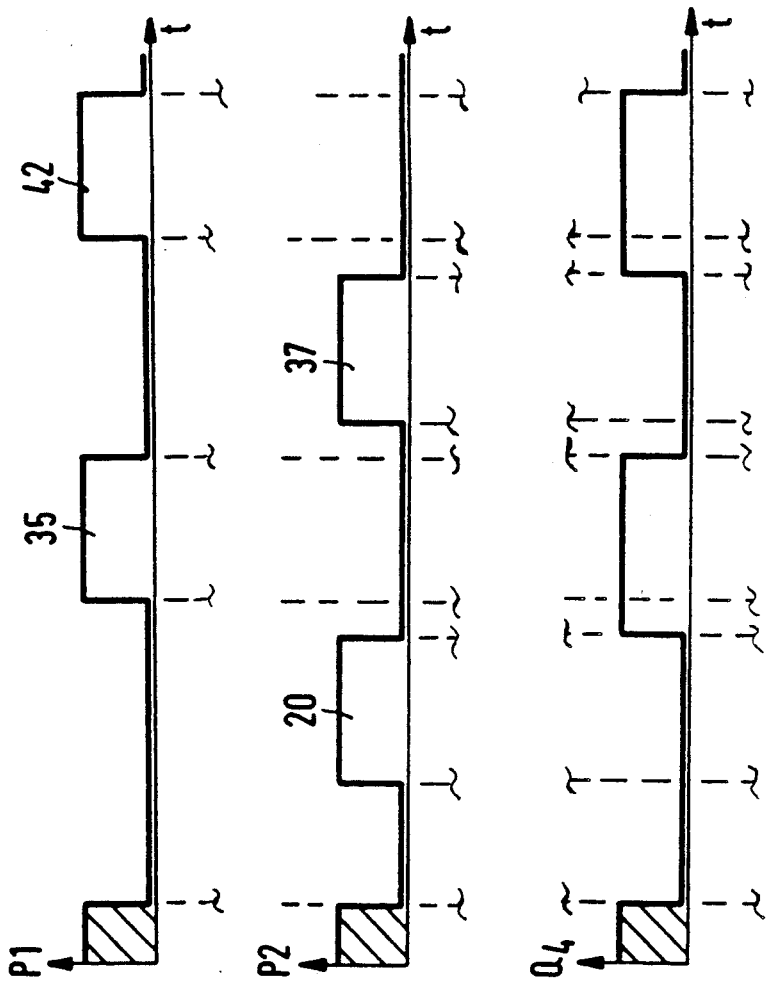

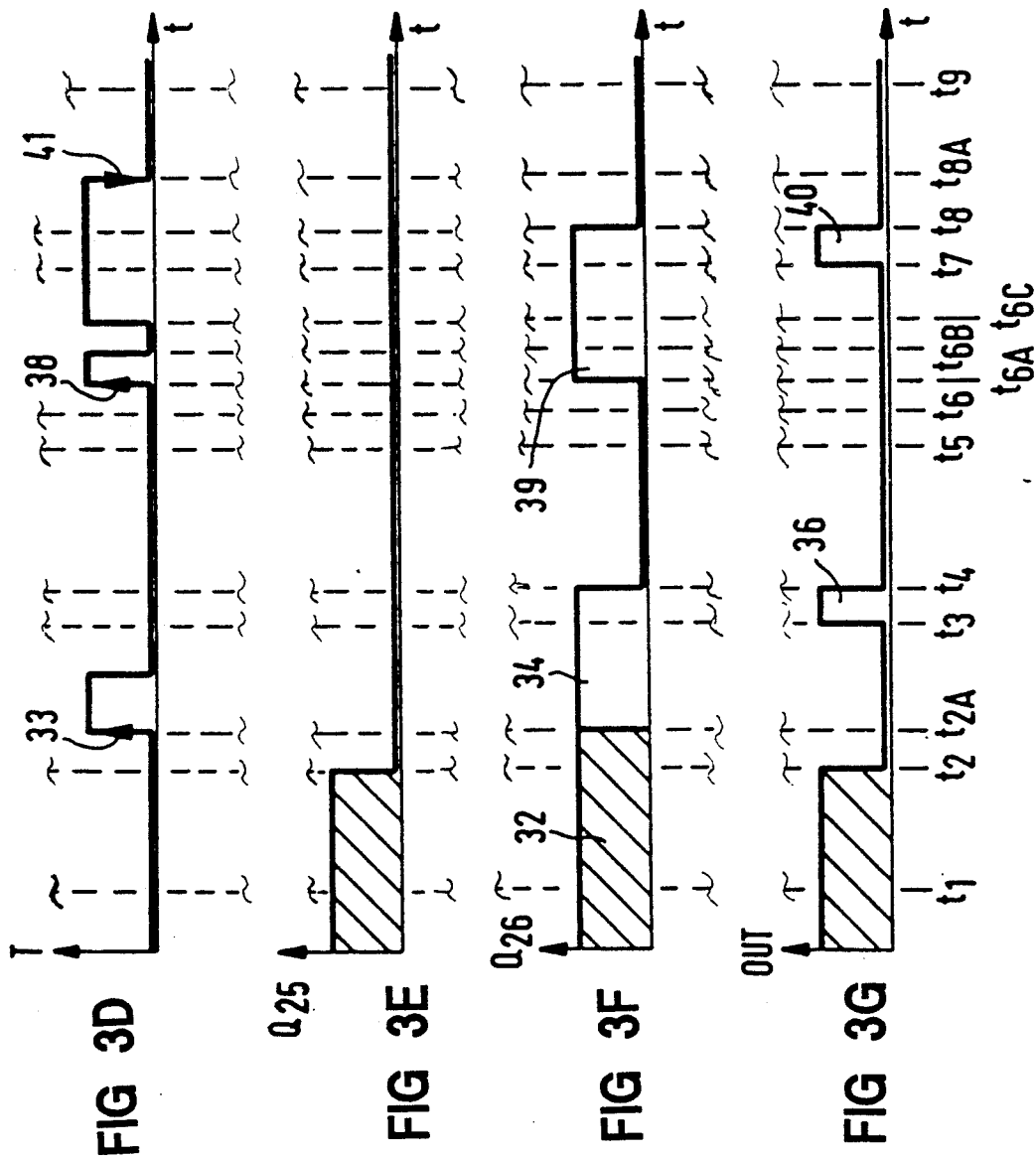

TO FIG 5F

DETECTOR CIRCUIT

BACKGROUND OF THE INVENTION

This invention relates to a detector circuit for detecting a state change of an unknown binary signal during a prescribable time window, with at least one first flip-flop circuit receiving said unknown binary signal at its clock input and receiving a first window signal indicative of said time window at its signal input.

In intergrated circuit tester technology, it is a major problem to detect whether a certain binary signal is stable during a predefined time interval or whether it changes its state during that interval. The result of such a test is either "signal state" or "signal unstable". Such a test must be performed even with very short time windows and with a high repetition rate.

From German Patent No. 33 46 942, it is already known to apply a window signal to the D input of a D flip-flop, whereas the unknown binary signal is fed to the clock input of said flip-flop. Therefore, the unknown binary signal may trigger the flip-flop if a transition occurs during the predefined time window. A further flip-flop is used to detect transitions occurring during the rising or falling edge of the window signal, respectively.

Said known detector circuit can be used for applications where a limited repetition rate is sufficient. The repetition rate of the test (i.e., the repetition rate of the window signal) cannot be increased beyond a certain limit as the recovery time specified for each flip-flop does not allow to apply a further window signal before this recovery time is over.

It is a major objective of the present invention to provide a detector circuit which allows higher repetition rates of the window signal, i.e. higher testing rates.

SUMMARY OF THE INVENTION

According to one aspect of the invention, a detector circuit of the type described above comprising at least one first flip-flop circuit receiving said unknown binary signal at its clock input and receiving a first window signal indicative of said time window at its signal input is characterized by the following features:

(1.1) The detector circuit comprises
  (1.1.1) a control circuit generating at least two pulse sequences which are shifted in time against each other, the pulses of said two sequences not overlapping in time,
  (1.1.2) at least one second flip-flop circuit also receiving said unknown binary signal at its clock input and receiving a second window signal at its signal input,
(1.2.1) the first of said pulse sequences is fed to the signal input of said first flip-flop as well as to a clear input of said second flip-flop, whereas
(1.2.2) the second of said pulse sequences is fed to the signal input of said second flip-flop as well as to a clear input of said first flip-flop.

In such a detector circuit, the control circuit generates a first pulse sequence establishing the time windows for the first flip-flop. Additionally, this first pulse sequence is used to clear the second flip-flop. Therefore, during a pulse in the first pulse sequence the first flip-flop is active, i.e. prepared to be clocked by a transition of the unknown binary signal, whereas the second flip-flop is held inactive.

During a pulse in the second pulse sequence, the roles of the flip-flops are reversed. In this case, the second flip-flop is prepared to trigger on a transition of the unknown binary signal, whereas the first flip-flop is held inactive.

As the pulses of the two pulse sequences generated by the control circuit do not overlap, the two flip-flops are active alternatingly. As the pulses of the two sequences may be very close to each other (but not overlapping), the repetition rate or testing rate can be increased considerably with respect to prior art detector circuits. For example, a detector circuit as described in German Patent No. 33 46 942 allows repetition or test rates of about 50 MHz using 100 k ECL logic, whereas the detector circuit according to the present invention allows repetition rates in the range of 150 MHz and above. This is primarily achieved by the use of two flip-flops which are activated alternatingly; in this circuit design, excessive recovery times can be avoided as each flip-flop is cleared during its inactive period.

A further advantage of the present invention is that the control circuit has to generate only two pulse trains as each pulse train has the two-fold function of activating one flip-flop and clearing the other flip-flop at the same time.

It is understood that the term "clear input" in this context does not restrict the invention in the sense that it comprises only flip-flops with a "clear" terminal. For example, such an input terminal may also be labeled as "RESET" or the like.

Depending on the selected logic, the detector circuit according to the invention may be used to trigger either on positive or on negative transitions of the unknown binary signal. To trace negative transitions, inverting clock inputs of the flip-flops may be used, or the unknown binary signal may be inverted.

Advantageously, flip-flops of the D type are used as these flip-flops are the simplest ones meeting the necessities of the present invention (clock, signal and clear/reset input), but it is understood that also flip-flops of another structure may be used.

The outputs of the two flip-flops may be further processed separately. However, according to a further advantageous aspect of the invention, the outputs of said flip-flops are fed to a multiplexing circuit the select input of which is controlled by said control circuit. Of course, it is also possible to combine the outputs of the flip-flops in another way, e.g. by logic gates. As—at a certain point in time—always only one flip-flop is active, the output of the other flip-flop contains irrelevant information (during the inactive period of said flip-flop), and during this period the output information of the active flip-flop may be transmitted. As the pulses of the two pulse sequences generated by the control circuit do not overlap, the two outputs of the flip-flops can be combined to one without loosing any information. For further processing of the combined output signal, it is advantageous to feed the output of the referred multiplexing circuit to a buffer circuit like an additional flip-flop; this guarantees easy further processing e.g. by a microprocessor.

In certain applications, differential flip-flops are used, e.g. flip-flops with a normal (positive) clock input and a further inverting (negative) clock input. According to another important aspect of the present invention, the output of at least one—preferable both—of said flip-flops is fed back to the input of a gate each, preferably an OR gate, the second input of said gate receiving the pulse sequence generated by said control circuit and the output of said gate being connected with the signal input of said flip-flop. The feedback loop causes a self-locking of the flip-flop whenever a transition has occurred during a time window; i.e., transitions occuring after the time window, but before the "clear" signal cannot cause the flip-flop to store a "0". The self-locking mechanism is cancelled by the next "clear" pulse. It is understood that the referred self-locking function may not only be implemented by an OR gate, but also, for example, by a NOR gate with an additional inverter or the like.

According to a further advantageous aspect of the present invention, the detector circuit comprises at least two additional flip-flops the signal and clear inputs of these additional flip-flops being basically wired in the same way as the signal and clear inputs of said first and second flip-flop, respectively, whereupon said first and second flip-flops are wired to trigger on a positive transition of the unknown binary signal, whereas said additional flip-flops are wired to trigger on a negative transition of the same.

In this embodiment, the detector circuit comprises two flip-flops which trigger on a positive transition of the unknown binary signal in active mode, these flip-flops being activated alternatingly; it further comprises two flip-flops triggering on negative transitions of the unknown binary signal and also being activated alternatingly. Triggering on negative transitions may be achieved, for example, by inversion of the unknown binary signal, by use of an inverting clock input or—if flip-flops with differential clock inputs are used—by reversing the non-inverting and the inverting clock input.

This embodiment guarantees that both positive and negative transitions of the unknown binary signal are recorded reliably, even if positive and negative transitions occur very close to each other. This is an important improvement with regard to prior detector circuits: even if a flip-flop would be used in prior art circuits with the capability of triggering on both positive and negative transitions, recording could fail if a positive transition occurred very close to a negative transition.

When using the detector circuit according to the present invention in an integrated circuit tester device, the unknown binary signal (the stability of which is under test) is generated by a comparator circuitry which receives an analog signal at its input. This comparator circuitry may, for example, generate a "1" if said analog signal exceeds a certain level and a "0" if the analog signal is below that level. As a binary signal can encode only two states, such binary signal may only represent two states of the corresponding analog signal. On the other hand, it is necessary in certain applications to detect more than two states of the analog signal, e.g. "0", "1" and TRI-STATE. As this TRI-STATE state corresponds to a floating, i.e. high-impedance state, it can be detected by applying the analog signal to a voltage divider, e.g. consisting of two resistors.

To encode these three states, a single binary signal is—as outlined above—not sufficient. According to a further preferred embodiment, the complete detector circuit is therefore duplicated, the first of said detector circuits receiving an unknown binary signal indicative of two first different states of an analog signal to be tested, whereas the second of said detector circuits receives a further unknown binary signal indicative of two other different states of said analog signal.

In this embodiment, the analog signal is fed to two comparator circuits, the first, for example, indicating HIGH and LOW state of the analog signal and the other indicating TRI-STATE or NON-TRI-STATE. The two binary signals are then fed to one of the detector circuits each. In this case, also the stability of the analog signal can be tested with respect to its TRI-STATE condition, e.g. if TRI-STATE changes to "0" or "1". Preferably, the outputs of the two detector circuits are combined to a common signal which indicates whether an unstability has occurred during a certain time window or not.

According to a further advantageous aspect of the invention, the detector circuit comprises at least one further flip-flop receiving the unknown binary signal at its input and the window signal at its clock input. This flip-flop serves to buffer the state of the unknown binary signal. A buffer circuit, in particular a flip-flop, may be used to buffer the output of said further flip-flop.

BRIEF DESCRIPTION OF THE DRAWING

A detector circuit embodying the invention will now be particularly described with reference to the accompanying drawings, in which:

FIG. 1a shows the control circuit of a detector circuit according to the invention.

DETAILED DESCRIPTION OF THE PREFERRED EMBODIMENT

FIG. 1a depicts a control circuit for the generation of two pulse sequences which are shifted in time against each other, the pulses of said two sequences not overlapping in time. A Pstart signal is fed via input line 1 to the clock terminal of a D flip-flop 2. The timing diagram of the PStart signal is shown in FIG. 2b. With every positive transition of a PStart pulse (indicated in FIG. 2b by arrows, cf. Ref. Nos. 3 and 22) flip-flop 2 (FIG. 1a) stores the signal at the D input.

Figure 2A:
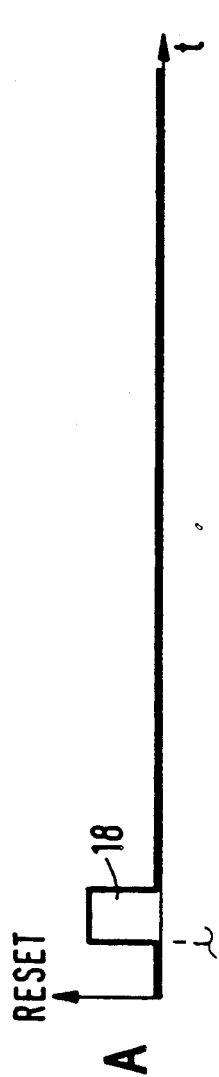
FIG. 2 is a timing diagram of the control circuit of FIG. 1a, FIG. 3 is a timing diagram of the detector circuit shown in FIG. 1b.
Figure 2B:
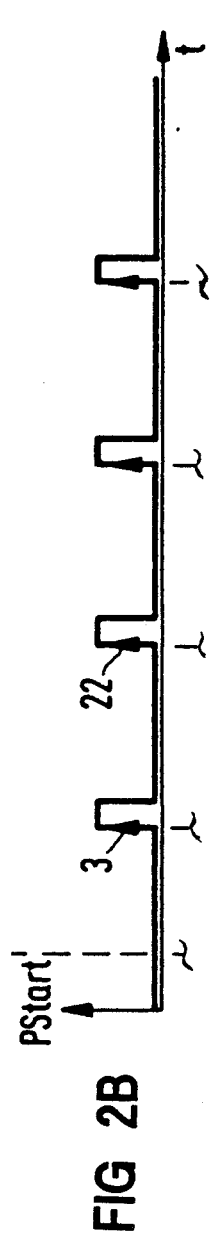
Figure 2C:
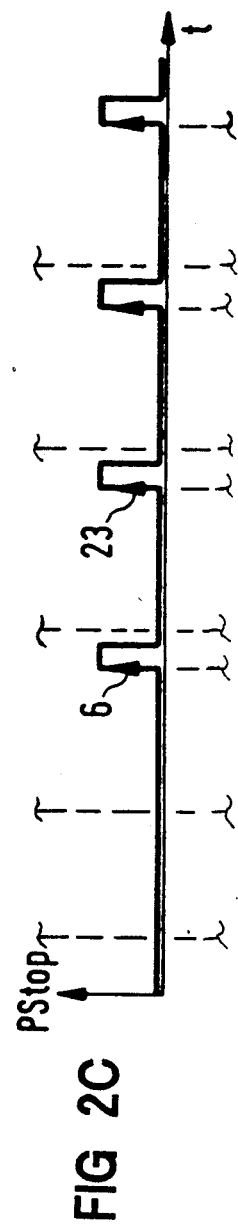

In similar manner, flip-flop 4 receives a PStop signal on input line 5 at its clock input. The PStop signal is shown in FIG. 2c. It has the same frequency as the PStart pulse train, but is delayed with reference to that sequence (according to FIG. 2, the delay is $t=t_{3-/2}$). With every active (positive) transition (cf. Ref. Nos. 6 and 23 in FIG. 2c), flip-flop 4 is clocked and stores the signal present at its D terminal.

Furthermore, a RESET pulse (shown in FIG. 2a) is fed via lines 7 and 8 to the reset terminals of flip-flops 2 and 4.

The Q output of flip-flop 2 is fed to an input terminal of a NOR gate 9, whereas its $\bar{Q}$ output is fed to an input terminal of a second NOR gate 10. This $\bar{Q}$ output is further fed back to the D input of flip-flop 2; therefore, this flip-flop operates as 2:1 frequency divider.

In similar manner, the $\overline{Q}$ output of flip-flop 4 is, on one hand, fed to the second input of NOR gate 9 as well as to the D input of flip-flop 4. Therefore, this flip-flop also operates as 2:1 frequency divider. The Q output of flip-flop 4 is fed to the second input of NOR gate 10; this signal, labeled as "Q4", is also used for further processing in the detector circuit (cf. line 11 in FIGS. 1a, 1b).

The outputs of NOR gates 9 and 10 generate pulse sequences P1 and P2 on lines 12 and 13, respectively.

Operation of the control circuit shown in FIG. 1a will now be explained in detail by means of the timing diagram shown in FIG. 2. As just mentioned, FIG. 2a depicts the RESET signal, FIG. 2b the PStart pulse train, FIG. 2c the PStop pulse train, FIG. 2d the Q output of flip-flop 2, FIG. 2e the Q output of flip-flop 4, FIG. 2f the P1 signal and FIG. 2g the P2 signal.

Prior to the occurrence of the reset pulse ($t < t_1$), the outputs of flip-flops 2 and 4 may be in either state as indicated by boxes 14 and 15 in FIGS. 2d and 2e. Therefore, the P1 and P2 signals may also be in either state (Ref. Nos. 16 and 17 in FIGS. 2f and 2g).

Upon the occurrence of a reset pulse 18, both flip-flops are reset and therefore, the Q outputs of these flip-flops are zero.

Upon the occurrence of the first PStart pulse 3 ($t = t_2$), flip-flop 2 toggles as indicated by 19. The $\overline{Q}$ output of flip-flop 2 is therefore "0", resulting in a "1" in the P2 sequence as indicated by 20.

With the first PStop pulse 6 ($t = t_3$), the Q output of flip-flop 4 also changes its state as indicated by 21. Therefore, an output pulse 20 in the P2 sequence of width $t_3 - t_2$ is generated. The pulse width of pulse 20 may be in the range of 2 ns or less using 100 k ECL logic.

The next pair of incoming pulses (PStop pulse 22 at $t = t_4$ and PStop pulse 23 at $t = t_5$) are used to generate—in similar manner—a pulse 24 in the P1 sequence.

It is evident that the control circuit shown in FIG. 1a generates two pulse sequences P1 and P2 which are shifted in time against each other—in this case, the delay is half a period—, the pulses of the two sequences not overlapping in time. The pulse width of these pulses may be very short, and they may be generated with a high repetition rate. The pulse sequences P1 and P2 as well as the Q output of flip-flop 4 (Q4) will be used for further processing as explained below. As these signals are only auxiliary signals, it is evident for those skilled in the art that also other control circuits may be used to generate such pulse sequences.

Figure 1B:
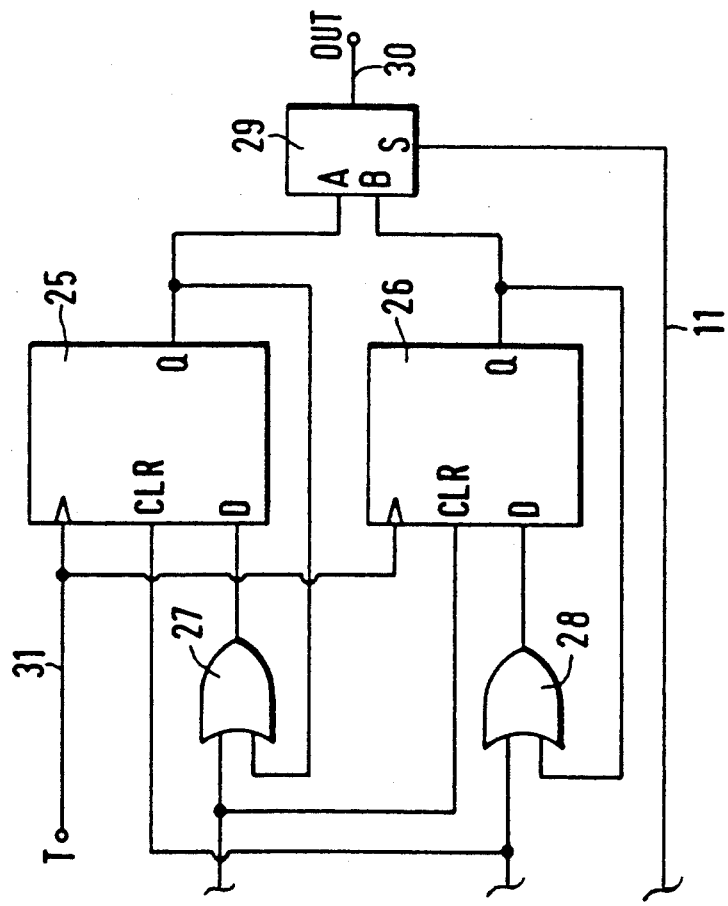
FIG. 1b depicts a first example of a detector circuit according to the present invention.

FIG. 1b depicts a first example of a detector circuit comprising two D flip-flops 25 and 26. The PI pulse sequence is fed to the D input of flip-flop 25 via OR gate 27 as well as to the clear (CLR) input terminal of flip-flop 26. On the other hand, the P2 pulse sequence is fed to the D input of flip-flop 26 via OR gate 28 as well as to the clear input of flip-flop 25. The Q outputs of flip-flops 25 and 26 are fed to the input terminals A and B of a multiplexer 29 which generates an output signal OUT on output line 30, the select input S of this multiplexer being controlled by signal Q4 on line 11. The Q outputs of both flip-flops are also fed back to OR gates 27 and 28, respectively. Further, the unknown binary signal T is fed to the clock inputs of flip-flops 25 and 26 on line 31.

Operation of the detector circuit shown in FIG. 1b will now be explained with reference to FIG. 3 which shows a timing diagram of that circuit. FIG. 3a depicts pulse sequence P1, FIG. 3b pulse sequence P2 and FIG. 3c the Q output of flip-flop 4. These diagrams are identical to those just shown in FIGS. 2f, 2g and 2e.

FIG. 3d shows the unknown binary signal T, FIG. 3e the Q output of flip-flop 25, FIG. 3f the Q output of flip-flop 26 and FIG. 3g the output signal OUT.

The time axes in FIG. 3 are shown in the same scale and with the same time references as in FIG. 2.

The first pulse 20 in the P2 sequence enables flip-flop 26 to trigger on positive transitions of the unknown binary signal T (prior to pulse 20, flip-flop 26 may be in either state as indicated by Ref. No. 32; this undefined state remains until the first actual positive transition of the unknown binary signal T occurs). In the shown example, flip-flops are used which trigger on a positive transition at their clock inputs; it is understood that, alternatively, also flip-flops which trigger on negative transitions at their clock inputs may be used.

At the same time ($t = t_2$), flip-flop 25 is cleared by pulse 20, i.e. flip-flop 25 is inactive during this time period ($t_2$ to $t_3$). Therefore, pulse 20 has the two-fold function of activating flip-flop 26 as well as clearing flip-flop 25. The "clear" terminals of flip-flops 25 and 26 could, for example, also be labeled as "reset" terminals or the like.

At $t = t_{2A}$, a positive transition of the unknown binary signal T occurs. The active (rising) edge 33 causes flip-flop 26 to store the signal present at its D terminal; as the P2 signal is "1", and as this signal is transmitted through OR gate 28, flip-flop 26 also stores a "1" as indicated by 34.

To avoid that the state of flip-flop 26 is changed by a further positive transition of the unknown binary signal T after the end of P2 pulse 20 and before the beginning of P1 pulse 35 which clears flip-flop 26, the Q output of flip-flop 26 is fed back to OR gate 28. This "self-locking circuit" ensures that the state of flip-flop 26 cannot be changed prior to the occurrence of clear pulse 35. Consequently, the state of flip-flop 26 cannot be changed in the time interval between $t = t_3$ and $t = t_4$.

If flip-flops triggering on both positive and negative transitions are used, the "self-locking mechanism" has the further function of ensuring that the flip-flop does not trigger on both the positive and negative transition during a certain time window (if that would happen, the flip-flop would indicate "binary signal stable", whereas, on the contrary, a positive as well as a negative transition had occurred).

The output of flip-flop 26 is transmitted to the output signal OUT as soon as multiplexer 29 transmits the signal at its B input terminal. The output of flip-flop 4 (cf. FIG. 3c) changes its state to "1" at $t = t_3$ causing selection of input terminal B of multiplexer 29; therefore, the output of flip-flop 26 indicating an unstability of the unknown binary signal T is transmitted to output OUT in the period when both flip-flops are inactive (from $t = t_3$ to $t = t_4$). As pulse 35 clears flip-flop 26, a "0" is transmitted after $t = t_4$.

It is evident that output signal OUT always indicates whether an unstability had occured in the unknown binary signal T during the time period when both flip-flops (25 and 26) are inactive, e.g. from $t = t_3$ to $t = t_4$, $t = t_5$ to $t = t_6$ etc.. This signal is always indicative of the stability of the unknown binary signal T during the preceding time window. If the unknown binary signal was stable, a "0" is transmitted; if, on the other hand, an unstability had occurred, a "1" is transmitted (cf. pulse 36 from $t = t_3$ to $t = t_4$ which indicates that an unstability in the unknown binary signal T had occurred).

The output signal OUT may further be buffered as will be explained by way of FIGS. 4 and 6.

With the occurrence of P1 pulse 35 at $t=t_4$, flip-flop 26 is cleared and flip-flop 25 activated, i.e. prepared to trigger on unstabilities (in this case, positive transitions) of the unknown binary signal T. In the shown example, signal T (cf. FIG. 3d) is stable during the second time window from $t=t_4$ to $t=t_5$. Therefore, a "0" occurs in output signal OUT during the next period where both flip-flops are inactive (from $t=t_5$ to $t=t_6$).

During the next time window 37 in the P2 sequence (from $t=t_6$ to $t=t_7$), the unknown binary signal shows a positive transition 38 at $t=t_{6A}$ which clocks flip-flop 26 (cf. Ref. No. 39 in FIG. 3f). Further transitions—either negative as shown at $t=t_{6B}$ or positive at $t=t_{6C}$—do not affect the state of flip-flop 26 during time window 37. Unstability 38 is transmitted to output signal OUT as shown by Ref. No. 40.

Figure 4:
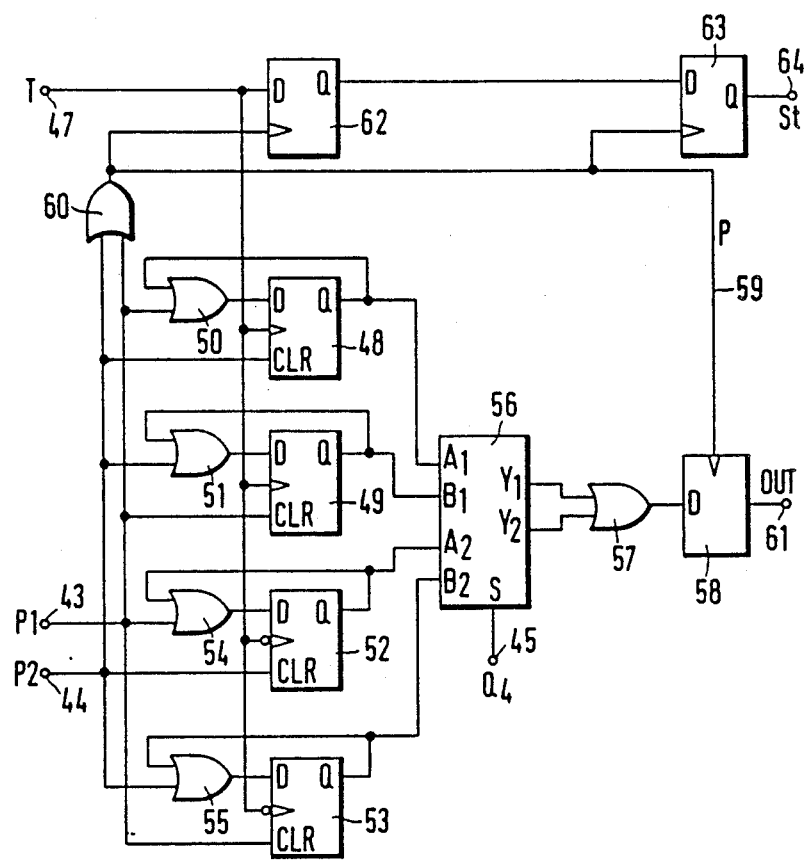
FIG. 4 depicts a second example of a detector circuit which can trigger on both positive and negative transitions of the unknown binary signal.

The circuit shown in FIG. 1b does not trigger on negative transitions of the unknown binary signal T (which may be regarded as a disadvantage which can be overcome by the circuit shown in FIG. 4). In FIG. 3, this is shown by way of negative transition 41 at $t=t_{8A}$ during time window 42 (from $t=t_8$ to $t=t_9$). This negative transition is not transmitted to output signal OUT.

The fundamental operation of the detector circuit shown in FIGS. 1a and 1b is, therefore, to activate flip-flops 25 and 26 alternatingly by pulse sequences P1 and P2, each of these pulse sequences activating one of those flip-flops and clearing the other one with the same pulse simultaneously. Readout of the signal indicating stability/ unstability of the unknown binary signal is performed in the time period when both flip-flops are inactive. This structure guarantees a very high repetition rate, i.e. the test can be performed with a frequency of 150 MHz and above using ECL logic, as the restrictions of the prior art circuits using only one flip-flop (which needs certain recovery time before the next window signal can be applied) is overcome by the invention.

FIG. 4 shows a second example of a detector circuit with two additional flip-flops wired to trigger on a negative transition of the unknown binary signal. The control circuit is not shown in that Figure; for the detector circuit shown in FIG. 4, the same control circuit as shown in FIG. 1a may be used.

According to FIG. 4, pulse sequence P1 generated by a control circuit according to FIG. 1a is fed to input terminal 43. In the same manner, pulse sequence P2 is fed to input terminal 44. Further input terminal 45 receives signal Q4 (the Q output of flip-flop 4, cf. FIG. 1a). The unknown binary signal T is fed to input terminal 47. Flip-flops 48 and 49 operate in the same manner as flip-flops 25 and 26 in FIG. 1b. They receive pulse sequences P1 and P2, respectively, each of the pulses activating one of the flip-flops and clearing the other one at the same time. These flip-flops trigger on a positive transition of the unknown binary signal. For the purpose of self-locking, their outputs are fed back to OR gates 50 and 51, respectively.

The detector circuit shown in FIG. 4 further comprises two additional flip-flops 52 and 53. These flip-flops are basically wired as flip-flops 48 and 49, i.e. they receive pulse sequences P1 and P2, respectively, via OR gates 54 and 55 at their D input terminals and at their clear (CLR) inputs, and their outputs are fed back via OR gates 54 and 55. The only difference with respect to flip-flops 48 and 49 is that the unknown binary signal T is fed to inverting clock inputs of flip-flops 52 and 53, i.e. these flip-flops trigger on a negative transition of the unknown binary signal T.

The outputs of flip-flops 48, 49, 52 and 53 are fed to a double multiplexer 56. If this multiplexer receives a "0" at its select inputs, inputs A1 and A2 are transmitted to outputs $Y_1$ and $Y_2$, whereas, if the signal at the select input terminal is "1", inputs B1 and B2 are transmitted to output terminals $Y_1$ and $Y_2$. The outputs of double multiplexer 56 are fed to an OR gate 57, the output of which is fed to the D input of a buffer flip-flop 58. This flip-flop receives a pulse sequence P at its clock input on line 59, pulse sequence P being an OR combination of the two pulse sequences P1 and P2 (cf. OR gate 60). The output of flip-flop 58 generates an output signal OUT at output terminal 61.

The circuit shown in FIG. 4 further comprises a flip-flop 62 which receives the unknown binary signal T at its D input and pulse sequence P at its clock input. This flip-flop is used to store a certain state of the unknown binary signal; its Q output is stored in a further buffer flip-flop 63 which generates a state signal St at output terminal 64. The clock input of this flip-flop is also triggered by pulse sequence P.

Figure 5A:
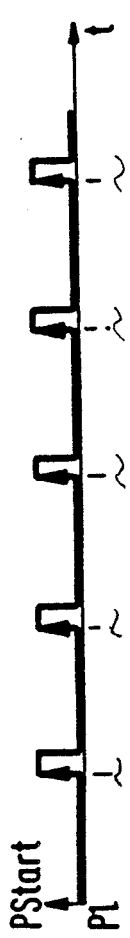
FIG. 5 is a timing diagram of the circuit of FIG. 4
Figure 5B:
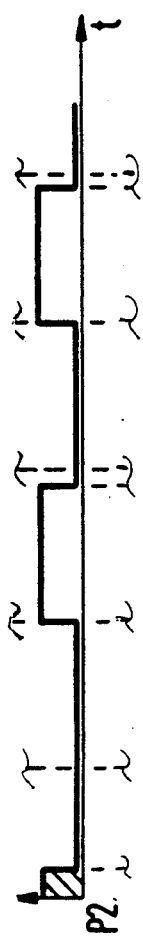
Figure 5C:
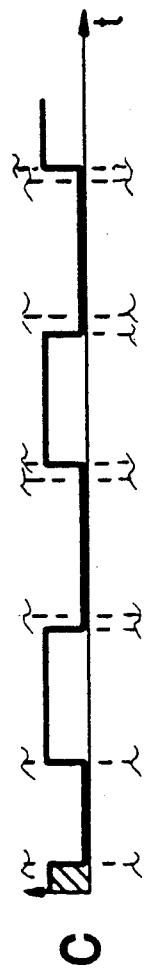
Figure 5D:
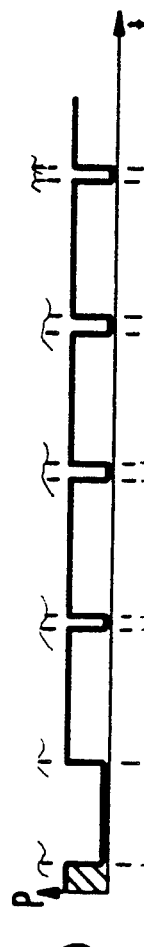
Figure 5E:
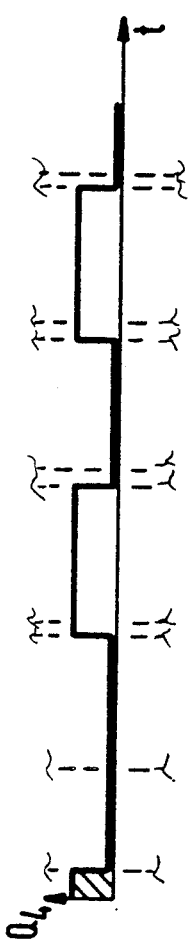

Operation of the circuit shown in FIG. 4 will now be explained with reference to FIG. 5 which depicts a timing diagram of that circuit. FIG. 5a shows the PStart signal, FIG. 5b the P1 pulse sequence, FIG. 5c the P2 pulse sequence, FIG. 5d the P pulse sequence (an OR combination of P1 and P2), FIG. 5e the Q output of flip-flop 4 (cf. FIG. 1a), FIG. 5f the unknown binary signal T, FIG. 5g the output of flip-flop 48, FIG. 5h the Q output of flip-flop 49, FIG. 5i the Q output of flip-flop 52, FIG. 5k the Q output of flip-flop 53, FIG. 5l the $Y_1$ output of multiplexer 56, FIG. 5m the $Y_2$ output of multiplexer 56, FIG. 5n the output of OR gate 57, FIG. 5o the output signal OUT, FIG. 5p the Q output of flip-flop 62 and FIG. 5q the St signal generated by the Q output of flip-flop 63.

Figure 5F:
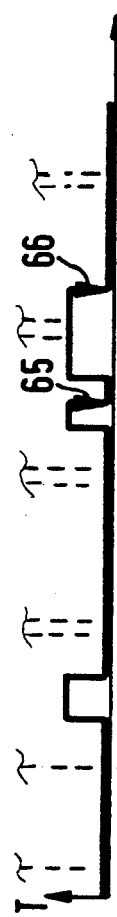
Figure 5G:
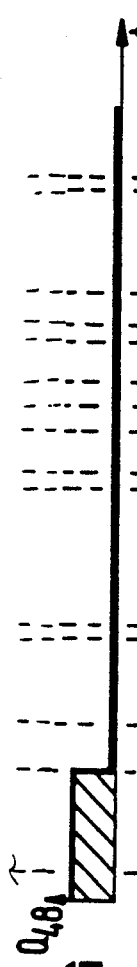
Figure 5H:
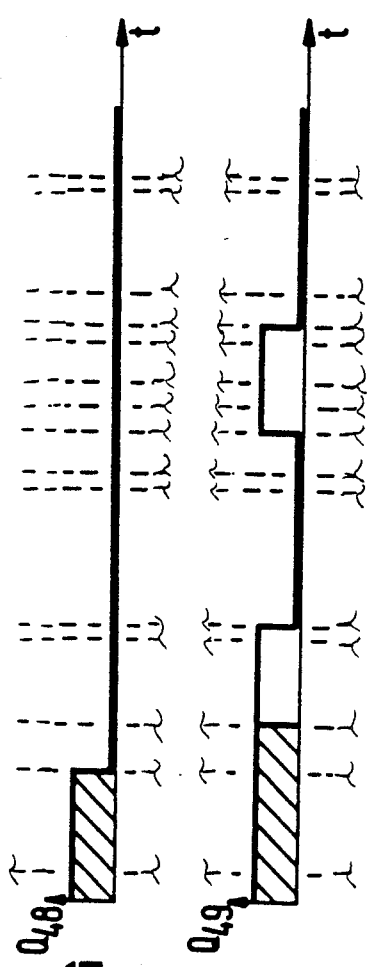
Figure 5I:
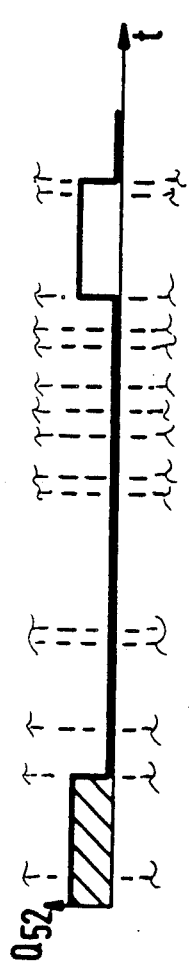
Figure 5K:
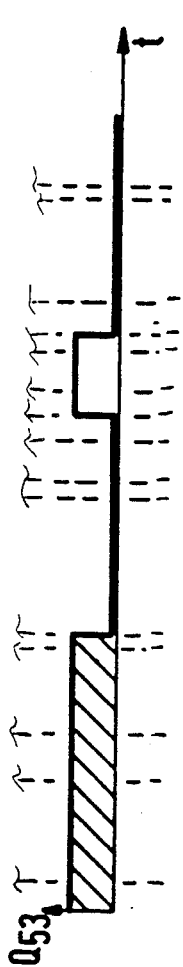
Figure 5P:
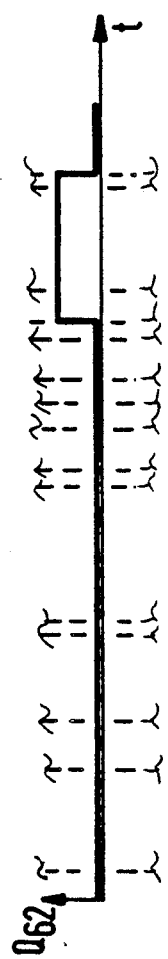
Figure 5Q:
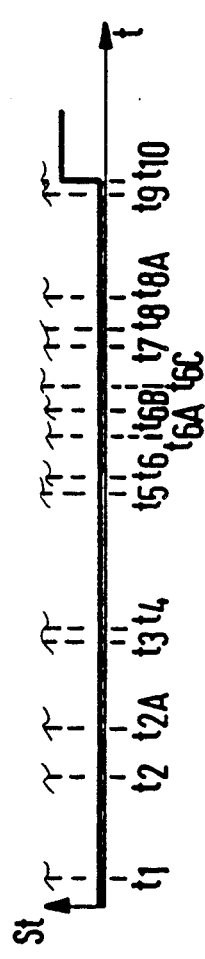

Flip-flops 48 and 49 operate in known manner; therefore, their output signals (cf. FIGS. 5g and 5h) are equal to those shown in FIGS. 3e and 3f (the unknown binary signal T—FIG. 5f—is assumed to be the same as in FIG. 3d). Therefore, flip-flops 48 and 49 trigger on positive transitions of signal T at $t=t_{2A}$ and $t=t_{6A}$.

Flips-flops 52 and 53 are wired to trigger on negative transitions of the unknown binary signal T. In the example shown in FIG. 5, flip-flop 53 is triggered by the negative transition (Ref. No. 65) at $t=t_{6B}$. In similar manner, flip-flop 52 is triggered by negative transition 66 of the unknown binary signal T at $t=t_{8A}$.

In the circuit shown in FIG. 4, flip-flops 48 and 52 are therefore activated at the same time by pulse sequence P1, one of these flip-flops—flip-flop 48—triggering on positive transitions and the other—flip-flop 52—triggering on negative transitions of the unknown binary signal T. In similar manner, flip-flops 49 and 53 are activated at the same time by pulse sequence P2, flip-flop 49 triggering on positive transitions and flip-flop 53 on negative transitions.

In the example shown in FIG. 5, flip-flop 49 is triggered by the positive transition of the unknown binary signal T at $t=t_{2A}$. This "1" state is transmitted to output $Y_1$ (cf. FIG. 5l) of multiplexer 56 between $t=t_3$ and $t=t_4$. This pulse passes OR gate 57 (FIG. 5n) and is stored in buffer flip-flop 58 between $t=t_4$ and $t=t_6$ for further processing (FIG. 5o).

During the time window between $t=t_4$ and $t=t_5$, the unknown binary signal T is stable. Therefore, the output of OR gate 57 is "0" during the read-out period between $t=t_5$ and $t=t_6$, and consequently a "0" is stored in buffer flip-flop 58 between $t=t_6$ and $t=t_8$.

In the time window from $t=t_6$ to $t=t_7$, there occur two positive transitions of the unknown binary signal T at $t=t_{6A}$ and $t=t_{6C}$. The first transition at $t=t_{6A}$ triggers flip-flop 49. This flip-flop is locked afterwards. The second positive transition at $t=t_{6C}$ does not affect the state of that flip-flop.

The negative transition of the unknown binary signal T at $t=t_{6B}$ further triggers flip-flop 53. As both flip-flops 49 and 53 indicate an unstability of the unknown binary signal T, outputs $Y_1$ and $Y_2$ (FIGS. 5$l$ and 5$m$) of multiplexer 56 indicate "1" in the readout period between $t=t_7$ and $t=t_8$. These outputs are combined to a pulse occurring at the output of OR gate 57 between $t=t_7$ and $t=t_8$ (cf. FIG. 5$n$). Therefore, buffer flip-flop 58 also indicates "1" between $t=t_8$ and $t=t_{10}$, see FIG. 5$o$.

In the time window between $t=t_8$ and $t=t_9$, a further negative transition 66 of the unknown binary signal T occurs at $t=t_{8A}$. This transition is sensed by flip-flop 52 which produces a "1" at output $Y_2$ (FIG. 5$m$) of multiplexer 56 between $t=t_9$ and $t=t_{10}$. This signal is transmitted to the output of OR gate 57 and leads to a "1" of signal OUT (FIG. 5$o$) after $t=t_{10}$.

The occurrence of a negative transition at $t=t_{8A}$ which is sensed by flip-flop 52 indicates the advantages of a detector circuit shown in FIG. 4 as such a negative transition could not be sensed by detector circuit as shown in FIG. 1$b$.

Output signal OUT (FIG. 5$o$) always indicates whether the unknown binary signal T was stable (OUT=0) during the preceding time window or whether it was unstable (OUT=1) regardless whether the unknown binary signal T has changed its state from "0" to "1" or from "1" to "0".

Flip-flop 62 (FIG. 5$p$) is clocked by pulse sequence P (FIG. 5$d$) and stores the state of the unknown binary signal T upon the start of a time window. Its state information is transmitted to buffer flip-flop 63 with a delay of one period. This is an indication whether the unknown binary signal D has changed its state from "0" to "1" or from "1" to "0" for further processing.

Figure 6:
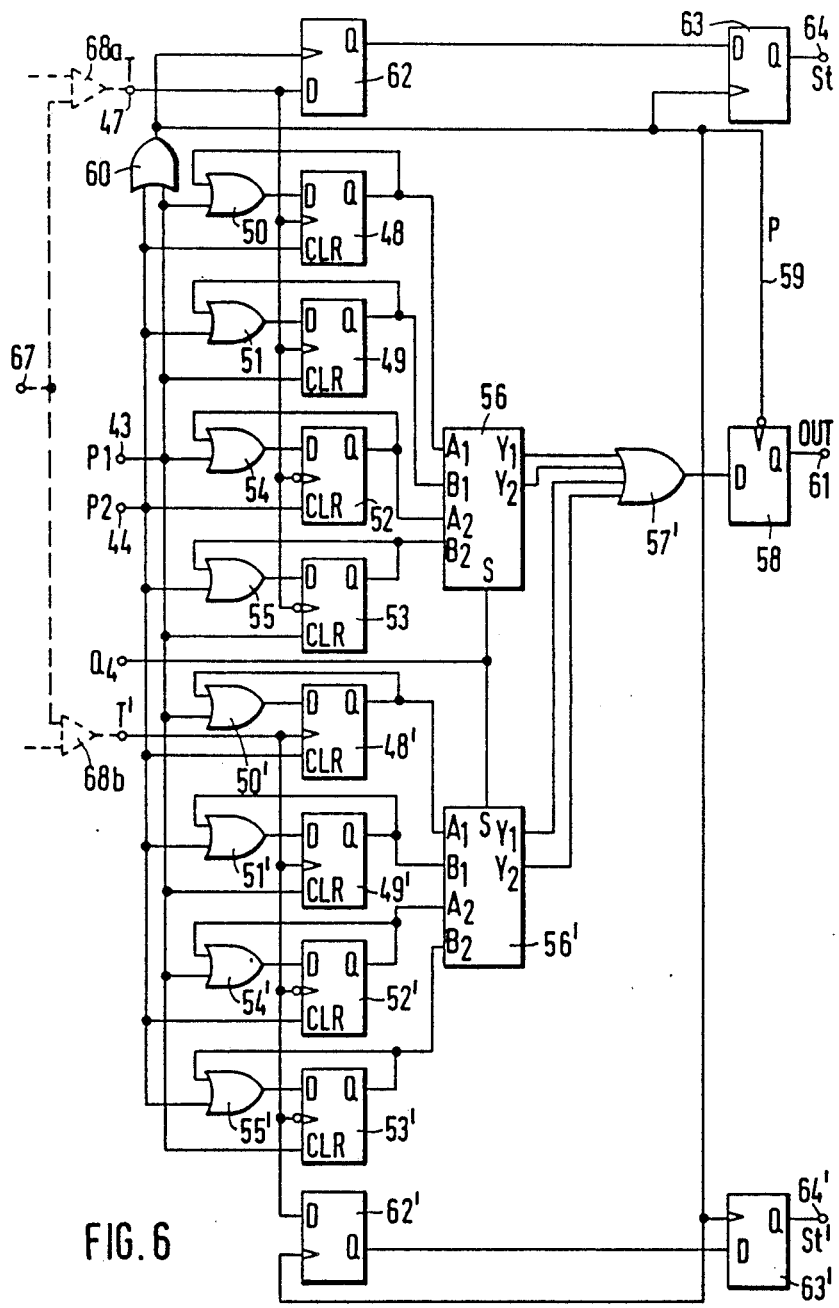
FIG. 6 depicts a third example comprising two detector circuits to distinguish at least three states of an analog signal.

FIG. 6 depicts a third example of a detector circuit according to the invention. This detector circuit also uses the control circuit shown in FIG. 1$a$; therefore, this control circuit is not shown in FIG. 6. As the circuit in FIG. 6 partially corresponds with the detector circuit shown in FIG. 4, the same reference numbers are used for the same objects to simplify the description.

Usually, the unknown binary signal T is obtained in an integrated circuit testing device by a comparator circuit which compares an analog signal to be tested with a certain reference level. As a binary signal may have only two different states, such a circuitry may only distinguish between two certain states of said analog signal, most commonly "0" and "1".

On the other hand, it might be desirable to distinguish between more than two states of said analog signal, e.g. to detect "0", "1" and TRI-STATE of said analog signal. TRI-STATE is the high-impedance state of said signal and may be detected, for example, by applying the analog signal to a voltage divider.

In such an application, the stability of the analog signal must also be tested with respect to the TRI-STATE state (also called high Z state). For example, the detector circuit should be able to indicate the transition from logic "1" to TRI-STATE.

The detector circuit in FIG. 6 is therefore a duplication of the circuit of FIG. 4. The corresponding objects in the duplicated part are marked with the same reference numbers as the first detector circuit, but with an additional apostrophe. The first detector circuit receives an unknown binary signal T indicative of "0" or "1" state of said analog signal, respectively. In similar manner, the duplicated detector circuit receives a second unknown binary signal T' indicative of a TRI-STATE condition of said analog signal, i.e. whether it is in high-impedance state or not. The comparator circuits comparing the analog signal 67 with predefined levels are schematically shown in broken lines (Ref. Nos. 68$a$ and 68$b$).

Flip-flops 48, 52, 48' and 52' are activated during the same time interval by pulse sequence P1. Flip-flop 48 is activated to trigger on a "0"–"1" transition of the analog signal, flip-flop 52 on a "1"–"0" transition, whereas flip-flop 48' triggers on the transition from high-impedance to low-impedance state, and flip-flop 52' may trigger on a transition from low-impedance state to high-impedance state.

Im similar manner, flip-flops 49, 53, 49' and 53' are activated during the next time window.

The Q outputs of flip-flops 48', 49', 52' and 53' are fed to a second double multiplexer 56'. The outputs of both multiplexers 56 and 56' are fed to an OR gate 57' which is—in contrast to OR gate 57 in FIG. 4—an OR gate with four input terminals.

Except for the differences described herein, the detector circuit shown in FIG. 6 operates in the same manner as the circuit shown in FIG. 4. This also applies to the "state" flip-flops 62, 63 and 62', 63'.

I claim:

1. Apparatus for detecting a state change of an unknown binary signal during predetermined time windows for integrated circuit testing devices, comprising:
   first flip-flop means having a signal input, a clear input, and an output connected to receive the unknown binary signal for detecting and signaling a state change in the unknown binary signal within a first time window;
   second flip-flop means having a signal input, a clear input, and an output connected to receive the unknown binary signal for detecting and signaling a state change in the unknown binary signal within a second time window; and
   control means for generating a first pulse sequence for the first flip-flop means signal input and the second flip-flop means clear input and for generating a second pulse sequence for the second flip-flop means signal input and the first flip-flop means clear input, which sequences are shifted in time from each other such that the pulses of the two sequences are not overlapping in time, wherein the first pulse sequence defines the first time window and clears the second flip-flop means whereby the second flip-flop means is held inactive for the first time window, and the second pulse sequence defines the second time window and clears the first flip-flop means whereby the first flip-flop means is held inactive for the second time window.

2. Apparatus for detecting a state change of an unknown binary signal as in claim 1, wherein the first and second flip-flop means are D type flip-flops and the signal inputs are the D inputs.

3. Apparatus for detecting a state change of an unknown binary signal as in claim 1, further comprising:
multiplexing means connected to the flip-flop means outputs having a select input controlled by the control for selecting a flip-flop means output; and
buffer means connected to the multiplexing means for holding the selected flip-flop means output.

4. Apparatus for detecting a state change of an unknown binary signal as in claim 3, further comprising:
an OR gate having a first and second input and an output, wherein the first OR gate input is connected to the output of the first flip-flop means, the second OR gate input is connected to receive the control means first pulse sequence, and the OR gate output is connected to the first flip-flop means signal input.

5. Apparatus for detecting a state change of an unknown binary signal as in claim 1, further comprising:
third flip-flop means having a signal input, a clear input, and an output connected to the control means and connected to receive the unknown binary signal for detecting and signaling a state change in the unknown binary signal within a first time window;
fourth flip-flop means having a signal input, a clear input, and an output connected to the control means and connected to receive the unknown binary signal for detecting and signaling a state change in the unknown binary signal within a second time window,
wherein the first and second flip-flop means detect positive transitions of the unknown binary signal and the third and fourth flip-flop means detect negative transitions of the unknown binary signal.

6. Apparatus for detecting a state change of an unknown binary signal as in claim 5, wherein:
the flip-flop means have clock inputs and inverting clock inputs, the clock inputs of the first and second flip-flop means and the inverting clock inputs of the third and fourth flip-flop means are connected to receive the unknown binary signal.

7. Apparatus for detecting a state change of an unknown analog signal having a first and second set of binary states during predetermined time windows for integrated circuit testing devices, comprising:
first flip-flop means having a signal input, a clear input, and an output connected to receive the unknown analog signal for detecting and signaling a state change in the first set of binary states within a first time window;
second flip-flop means having a signal input, a clear input, and an output connected to receive the unknown analog signal for detecting and signaling a state change in the first set of binary states within a second time window;
first control means for generating a first pulse sequence for the first flip-flop means signal input and the second flip-flop means clear input and for generating a second pulse sequence for the second flip-flop means signal input and the first flip-flop means clear input, which sequences are shifted in time from each other such that the pulses of the two sequences are not overlapping in time, wherein the first pulse sequence defines the first time window and clears the second flip-flop means whereby the second flip-flop means is held inactive for the first time window, and the second pulse sequence defines the second time window and clears the first flip-flop means whereby the first flip-flop means is held inactive for the second time window;
third flip-flop means having a signal input, a clear input, and an output connected to receive the unknown analog signal for detecting and signaling a state change in the second set of binary states within a first time window;
fourth flip-flop means having a signal input, a clear input, and an output connected to receive the unknown analog signal for detecting and signaling a state change in the second set of binary states within a second time window; and
second control means for generating a third pulse sequence for the third flip-flop means signal input and the fourth flip-flop means clear input and for generating a fourth pulse sequence for the fourth flip-flop means signal input and the third flip-flop means clear input, which sequences are shifted in time from each other such that the pulses of the two sequences are not overlapping in time, wherein the third pulse sequence defines the first time window and clears the fourth flip-flop means whereby the fourth flip-flop means is held inactive for the first time window, and the fourth pulse sequence defines the second time window and clears the third flip-flop means whereby the third flip-flop means is held inactive for the second time window.

8. Apparatus for detecting a state change of an unknown analog signal as in claim 7, wherein:
the binary states of the first set of binary states are HI and LOW, and the binary states of the second set of binary states are TRI-STATE and NON-TRI-STATE.

* * * * *